(12) United States Patent
Stack

(10) Patent No.: US 6,613,597 B2
(45) Date of Patent: Sep. 2, 2003

(54) OPTICAL CHIP PACKAGING VIA THROUGH HOLE

(75) Inventor: Richard Stack, Amherst, NH (US)

(73) Assignee: Xanoptix, Inc., Merrimack, NH (US)

( * ) Notice: Subject to any disclaimer, the term of this patent is extended or adjusted under 35 U.S.C. 154(b) by 0 days.

(21) Appl. No.: 10/183,847

(22) Filed: Jun. 27, 2002

(65) Prior Publication Data

US 2003/0026553 A1 Feb. 6, 2003

Related U.S. Application Data

(63) Continuation-in-part of application No. 09/896,189, filed on Jun. 29, 2001, and a continuation-in-part of application No. 09/897,160, filed on Jun. 29, 2001, and a continuation-in-part of application No. 09/896,983, filed on Jun. 29, 2001, and a continuation-in-part of application No. 09/897,158, filed on Jun. 29, 2001, and a continuation-in-part of application No. 09/896,665, filed on Jun. 29, 2001.

(60) Provisional application No. 60/302,578, filed on Jun. 29, 2001.

(51) Int. Cl.[7] ............... H01L 21/00; H01L 27/15; H01L 31/12; H01L 33/00

(52) U.S. Cl. ............... 438/27; 257/82; 438/26

(58) Field of Search ............... 438/26, 27, 28, 438/55, 64, 65; 257/81, 82

(56) References Cited

U.S. PATENT DOCUMENTS

| | | | | |
|---|---|---|---|---|
| 5,091,018 | A | * 2/1992 | Fraas et al. | 136/246 |
| 5,149,958 | A | * 9/1992 | Hallenbeck et al. | 250/216 |
| 5,359,208 | A | * 10/1994 | Katsuki et al. | 257/82 |
| 6,318,909 | B1 | 11/2001 | Giboney et al. | |
| 6,485,993 | B2 | * 11/2002 | Trezza et al. | 438/22 |
| 2002/0072138 | A1 | * 6/2002 | Trezza et al. | 438/23 |
| 2002/0090749 | A1 | * 7/2002 | Simmons | 438/64 |

OTHER PUBLICATIONS

Anderson, B., "Rapid Processing And Properties Evaluation Of Flip–Chip Underfills", Dexter Electronic Materials, 9 pages.

Aoki, Y., "Parallel and Bi–Directional Optical Interconnect Module Using Vertical Cavity Surface Emitting Lasers (VCSELs) and 3–D Micro Optical Bench (MOB)", *IEEE*, pp. 9 and 10, 1999.

Chou, B. et al., "Multilayer High Density Flex Technology", *IEEE*, pp. 1181–1189, 1999.

Datta, M. et al., A low–cost electroless plating method for producing flip–chip bondable and wire–bondable circuit pads for smart pixel application, *IEEE*, pp. 99–100, 1998.

Giboney, K.S., "Parallel–Optical Interconnect Development at HP Laboratories", *SPIE*, vol. 3005, pp. 193–201, Feb. 1997.

Goldstein, J. et al., "Fluxless Flip–Chip For Multichip Modules", *IEEE*, pp. 39–43, 1996.

Imler, B. et al., "Precision Flip–Chip Solder Bump Interconnects for Optical Packaging", IEEE Electronic Components and Technology Conference, pp. 508–512, 1992.

Maj, T. et al., "Interconnection of a two–dimensional array of vertical–cavity surface–emitting lasers to a receiver array by means of a fiber image guide", *Applied Optics*, vol. 39, No. 5, pp. 683–689, Feb. 10, 2000.

(List continued on next page.)

Primary Examiner—Carl Whitehead, Jr.
Assistant Examiner—William Vesperman
(74) Attorney, Agent, or Firm—Morgan & Finnegan, LLP

(57) ABSTRACT

A method of packaging an optical chip or an optical chip with an electronic chip that allows for close connections between the two chips. The method reduces parasitic capacitance and inductance, and provides unobstructed optical access while allowing for connection of a heat sink to the electronic chip for cooling.

14 Claims, 5 Drawing Sheets

OTHER PUBLICATIONS

McLaren T. et al., "Assembly of VCSEL Based Smart Pixel Arrays", *IEEE/LEOS Summer Topical Meeting: Smart Pixels*, pp. 49 and 50, Aug. 1996.

Ohki, A. et al., "Multi–channel optical coupling between VCSEL arrays and multimode optical fibers for a 40–channel parallel optical interconnection module", *IEEE*, pp. 47 and 48, 1998.

Ohsaki, T., "Electronic Packaging in the 1990's—A Perspective From Asia", *IEEE Transactions On Components, Hybrids, And Manufacturing Technology*, vol. 14, No. 2, pp. 254–261, Jun. 1991.

Quimet, S. et al., "Wirebonding PBGA Manufacturing Challenges From Fine to Ultrafine Pitch", *Future Fab International*, pp. 297–301.

* cited by examiner

OPTICAL CHIP PACKAGING VIA THROUGH HOLE

CROSS REFERENCE TO RELATED APPLICATIONS

This application claims priority under 35 USC 119(e)(1) of U.S. Provisional Patent Application Serial No. 60/302,578 filed Jun. 29, 2001.

This application is also a continuation in part of commonly assigned U.S. patent application Ser. Nos. 09/896,189, 09/897,160, 09/896,983, 09/897,158 and 09/896,665, all filed Jun. 29, 2001.

FIELD OF THE INVENTION

The present invention relates to optical chips and, more particularly, to optical chip packaging.

BACKGROUND

Opto-electronic chips have the ability to provide huge optical bandwidth. However, that data sent or received optically needs to get into and out of the chips electrically. Thus, the amount of electronic I/O needs to be large so as not to unduly create a bottleneck in the flow of data. Given the constraints on how fast an individual electrical line can be, the requirement for a large amount of I/O typically translates into a large number of I/O pads on the chip. However, the ability to place many electrical I/O connections a chip is counterbalanced by the need to place the I/O connections as close together as possible.

Typically, users of optical modules (containing one or more opto-electronic chips) or designers of components on which those modules mount, like to have the modules configured so that the modules will mount onto circuit boards and have the electrical I/O connections at a 90 degree angle to the optical I/O connection. Thus, it is desirable to allow the electrical signals to traverse a 90 degree bend.

Moreover, to the extent optical or opto-electronic chips are connected to flex circuits, they are typically connected using wirebonding techniques. Such techniques introduce undesirable parasitic capacitance, which is particularly detrimental to high frequency operation.

Since a goal with these modules is to bring data in and out as quickly as possible, it is important to ensure that the speed of each of the electrical connections to the chip can support the highest bandwidth (i.e. data rates) possible.

The use of flexible circuits to make 90 degree electrical turns to allow electrical access to occur at a right angle to optical access per se is known, for example, from D. Pommerrenig, D. Enders, T. E. Meinhardt, "Hybrid Silicon Focal Plane Development: an Update," SPIE Vol 267, Staring Infrared Focal Plane Technology, (1981) at p. 23. This reference describes an approach for soldering or welding cables to the backside of an optical chip for 90 degree turning. A chip produced using the prior art approach is shown in FIG. 1. Illustrated is a detector 2, a flex chip 4, a module base 6 and a MUX chip 10. However, the approach suffers from the same problems noted above, as is evident in FIG. 1, namely providing optical access inhibits access to the device for cooling.

More recent attempts have followed the same basic approach, but have electrically connected the electronic chip to the flex circuit using wirebond techniques, for example, as done with Agilent Technologies PONI-1 POSA Package, or using other edge connecting metalized connections, for example, beamleads.

All the foregoing approaches however have used a single-side access flex circuit.

In addition, because wirebonds are used in the prior art, the use of wirebonds limits the number of electrical connections possible between the electronic chip and the flex circuit (since the wirebonds require a larger electrical attachment area than a corresponding number of connections using flip-chip connection techniques. Wirebonds or other extended metal connectors coming off a chip also have large capacitances and inductances which limit the speed of the off-chip connection and also increases the electrical crosstalk/noise between adjacent electrical channels.

FIG. 2 shows one such example of a flex circuit arrangement that allows the optical devices to be placed on top of the electronic chip, but the configuration is still limited by off-electronic-chip wiring and still inhibits access to the non-active side for cooling. Illustrated in FIG. 2 is an optional auxiliary chip 12, a chip to flex connection 14 an electronic chip 16 and an optical device 20.

Presently, there is no way to package an optical chip or an optical chip with an electronic chip (i.e. create an opto-electronic chip) that allows for close connections between the two, reduces parasitic capacitance and inductance, provides unobstructed optical access while allowing for connection of a heatsink to the chip for cooling.

SUMMARY OF THE INVENTION

Our invention involves an approach to the integration of optical or opto-electronic chips with electrical connectors.

Our approach circumvents the need for off-chip electronic wiring or electrical lead-oriented connection approaches. Note that the flex prior art of circuit FIG. 2 exists to the right-side of the electronic chip. Hence it is difficult, if not impossible, to effectively attach a heatsink to aid in cooling the electronic chip, since it can not be placed on the front of the chip without impeding optical access and it cannot be attached to the back of the electronic chip (on the rightside of the chip of FIG. 2 because the flex circuit is in the way.

One advantage obtainable in accordance with the invention is the approach allows high density, high speed, electrical connections to be made to dense opto-electronic chips while allowing optical access to those chips.

Another achievable advantage is the ability to provide the above high speed connections while still allowing for easy optical access for edge-mounted optical components.

Advantageously, since the optical component community is moving toward (or already uses) flex circuits to connect optical modules to circuit cards, our technique does not "buck the trend" but rather goes along with so as to allow for greater acceptance.

In addition, this technique provides the ability to integrate electronic I/O pads on optoelectronic chips in multi-tiered rows. Still further, this technique allows the multi tiered rows to even be away from the optical or opto-electronic chip edge.

Still further, our technique minimizes parasitic electronic capacitance and inductance on flex circuit-to-chip connections.

In addition, the technique of placing the optical or opto-electronic chip on the backside of the flex allows for easy heat sink access to the chip without impeding or interfering with the optical path, irrespective of whether the chip contains topside active or backside (also called bottom) active (also called bottom active) devices.

The advantages and features described herein are a few of the many advantages and features available from representative embodiments and are presented only to assist in understanding the invention. It should be understood that they are not to be considered limitations on the invention as defined by the claims, or limitations on equivalents to the claims. For instance, some of these advantages are mutually contradictory, in that they cannot be simultaneously present in a single embodiment. Similarly, some advantages are applicable to one aspect of the invention, and inapplicable to others. Thus, this summary of features and advantages should not be considered dispositive in determining equivalence. Additional features and advantages of the invention will become apparent in the following description, from the drawings, and from the claims.

DETAILED DESCRIPTION

In overview, by allowing the flex circuit to have a through-hole in it and bonding the optical or opto-electronic chip to the back side of the flex circuit, for example, using flip-chip bonding techniques, a dual-sided flex circuit is created that can have contacts to the optical or opto-electronic chip on the backside and contacts for connection to the a printed circuit board (PCB) on the front side. One example of such a dual side flex circuit 30 in accordance with the invention is shown in perspective in FIG. 3. The through-hole allows optical access to the optical or opto-electronic chip while the placement of that chip on the back of the flex circuit also allows for good thermal contact with the chip to be made for cooling. Moreover, the placement achieves the foregoing while allowing for a large numbers of connections to be made to the optical or opto-electronic chip via the flex circuit.

Advantageously, our technique works whether the optical devices are topside active or back side (bottom side) active, as long as the direction of emission (or, in the case of photodetectors receipt) of light is away from the electronic chip to which the optical devices are hybridized. In addition, the technique can also be employed in instances where there is some element located between the optical devices and the opening, provided that the element is optically transparent to the wavelength of light the active device operates with.

The invention solves the problem by placing optical devices on top of the electronic chip, through a hybridization process, for example using one of the techniques described in the commonly assigned U.S. patent application Ser. Nos. 09/896,189, 09/897,160, 09/896,983 and 09/897,158, all filed Jun. 29, 2001 and entitled "Opto-Electronic Device Integration", the entire disclosures of which are incorporated herein by reference, and bonding the electronic chip directly to a circuit card which contains a cut-out opening in it to allow optical access for the optical devices while providing access to the electronic chip for cooling. Depending upon the particular case, the bondings described herein can be performed using conventional techniques or according to the technique described in U.S. patent application Ser. No. 09/896,665 filed Jun. 29, 2001 and entitled "Successive Integration of Multiple Devices Process and Product", the entire disclosure of which is incorporated herein by reference.

As a result, signals can be brought out from the chip through a double side access circuit card to a conventional set of electrical I/O pads that can be used to attach the module to a printed circuit board. By doing direct integration, performance and cost limitations associated with wiring or using other electrical attachment mechanisms are reduced or dispensed with entirely.

Figure 4:
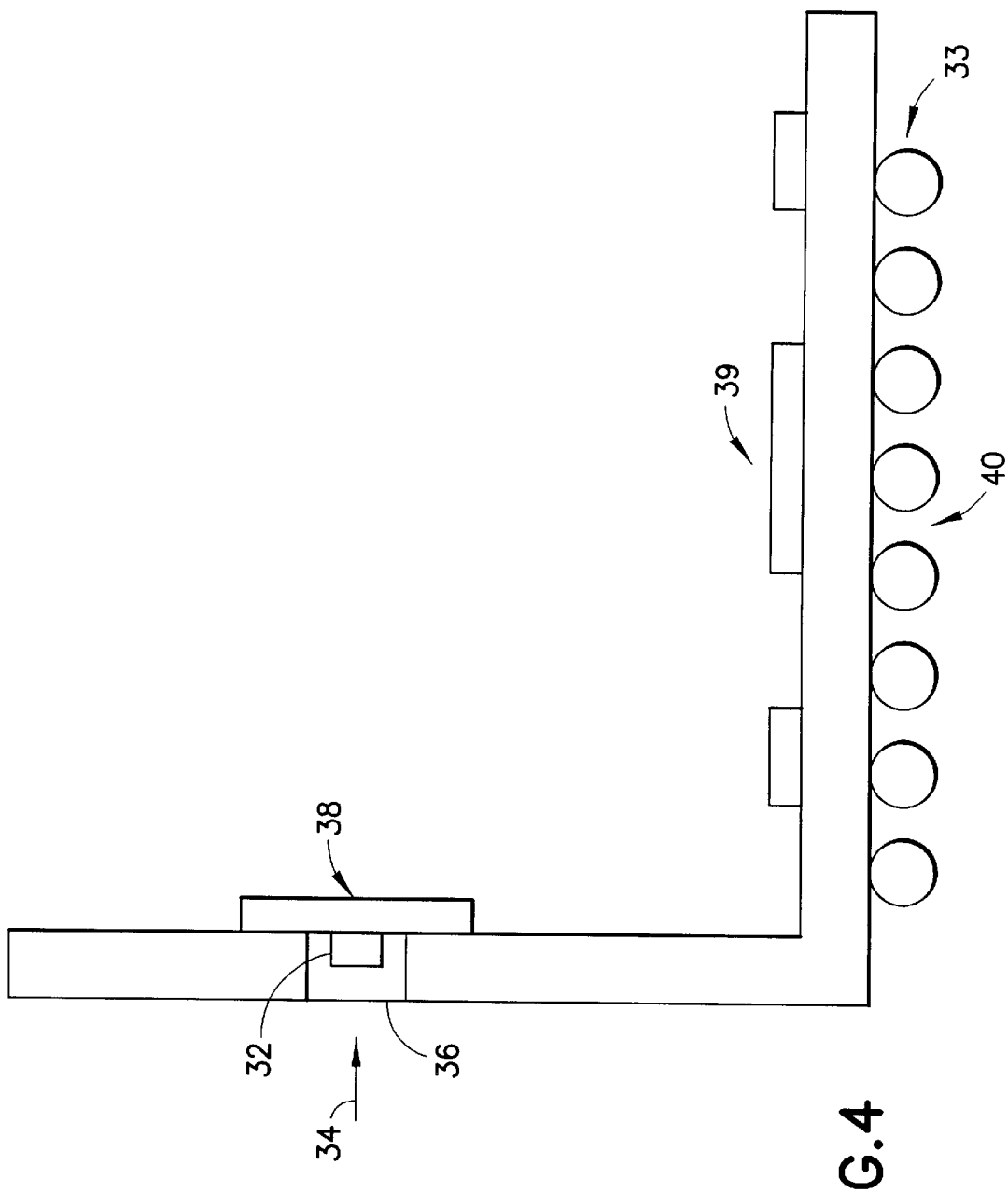
FIG. 4 shows another example implementation in accordance with the teachings of the invention.

FIG. 4 shows another example implementation in accordance with the teachings of the invention. As shown in FIG. 4, the process begins with creation of, or obtaining, an electronic chip onto which optical devices are attached, for example, as described in Attachment A. Shown in FIG. 4 is an optical device 32, a ball grid array (BGA) connector 33, an optical access path 34, an opening in the flex 36, an electronic chip 38, an optional auxiliary chip 39 and an electrical access 40.

Alternatively, or in addition, electrical connections between the optical and electronic devices can be done by: thin beam leads, or compression or reflow soldering methods for either frontside or backside emitting devices, such as described in, for example, J. Longo, D. Cheung, A. Andrews, C. Wang, and J. Tracy, "Infrared Focal Planes in Intrisic Semiconductors," IEEE Transactions on Electron Devices, Vol ED-25 No 2, February 1978. The optical devices are placed on the electronic chip so that the devices' optical access (i.e. optical input to or optical output from) is via the side of the optical devices opposite the electronic chip.

Figure 5A:
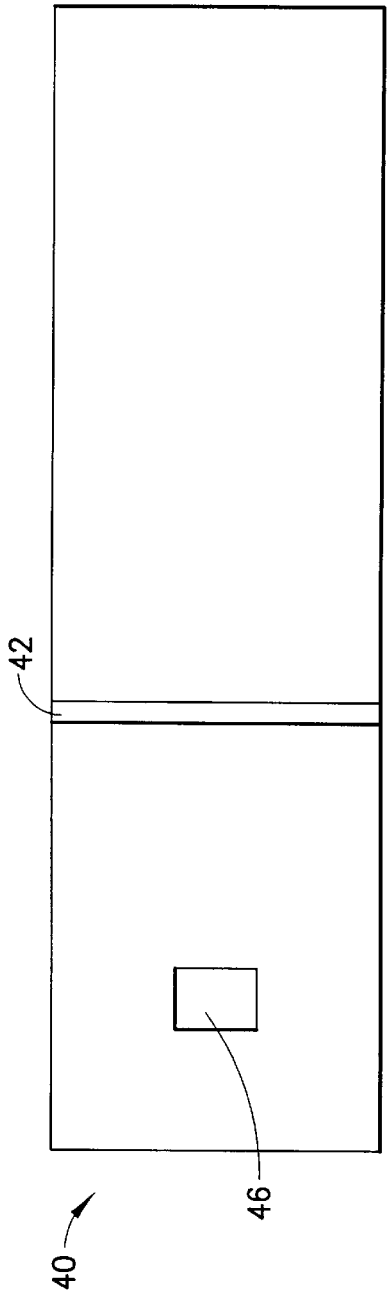
FIG. 5A shows a top view of an example double sided flex circuit with a through-hole for use in accordance with the invention.
Figure 5B:
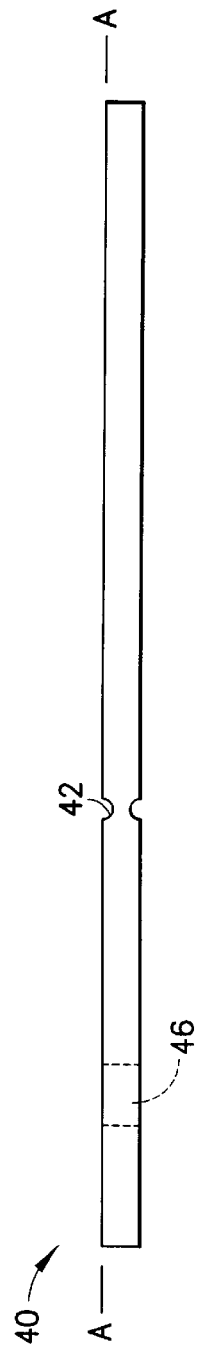
FIG. 5B shows a side view of the flex circuit of FIG. 5A.
Figure 5C:
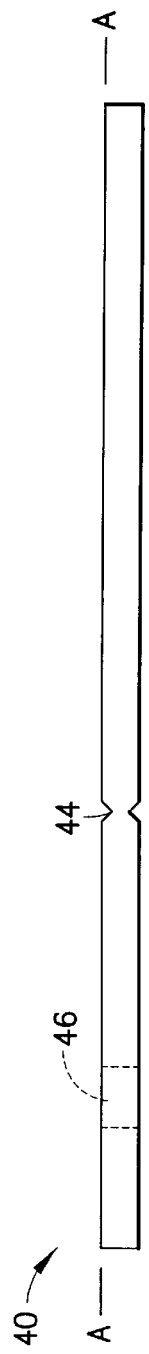
FIG. 5C shows a side view of an alternative variant of the flex circuit of FIG. 5A.

A flexible or "flex" circuit is used that has traces, is multi layered, and/or contains embedded wires to take the electrical signals from the electronic chip down the flex sheet to a connector, for example, a ball grid array (BGA) connector, which can be attached to conventional circuit boards via industry standard techniques. A flex circuit 42 is scored or compressed along a line 42 or 44 across the flex circuit 40, such as shown in FIG. 5A in top view and in FIG. 5B or in an alternative variant in FIG. 5C (both in side view). The purpose of the score or compression is to ensure that the bend is located in a consistent position from flex circuit to flex circuit, the particular score or compression used being irrelevant to the invention, so long as the purpose is satisfied without damage to the connections or wires passing across it.

Figure 1:
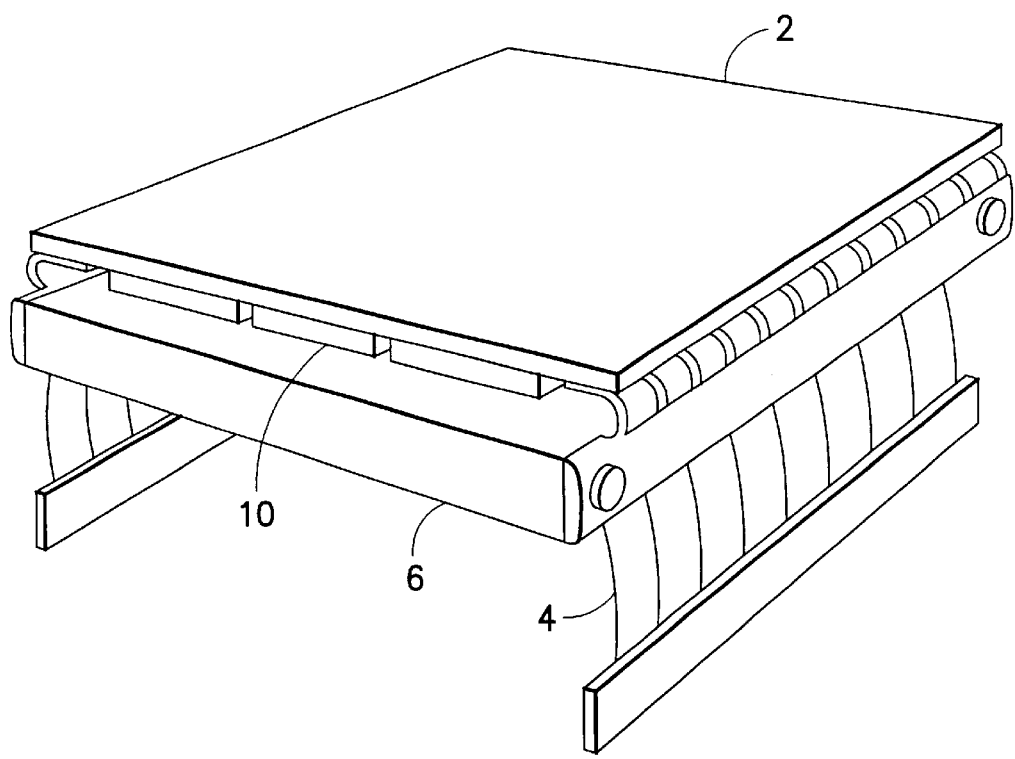
FIG. 1 shows a chip and flex circuit according to a prior art approach.
Figure 2:
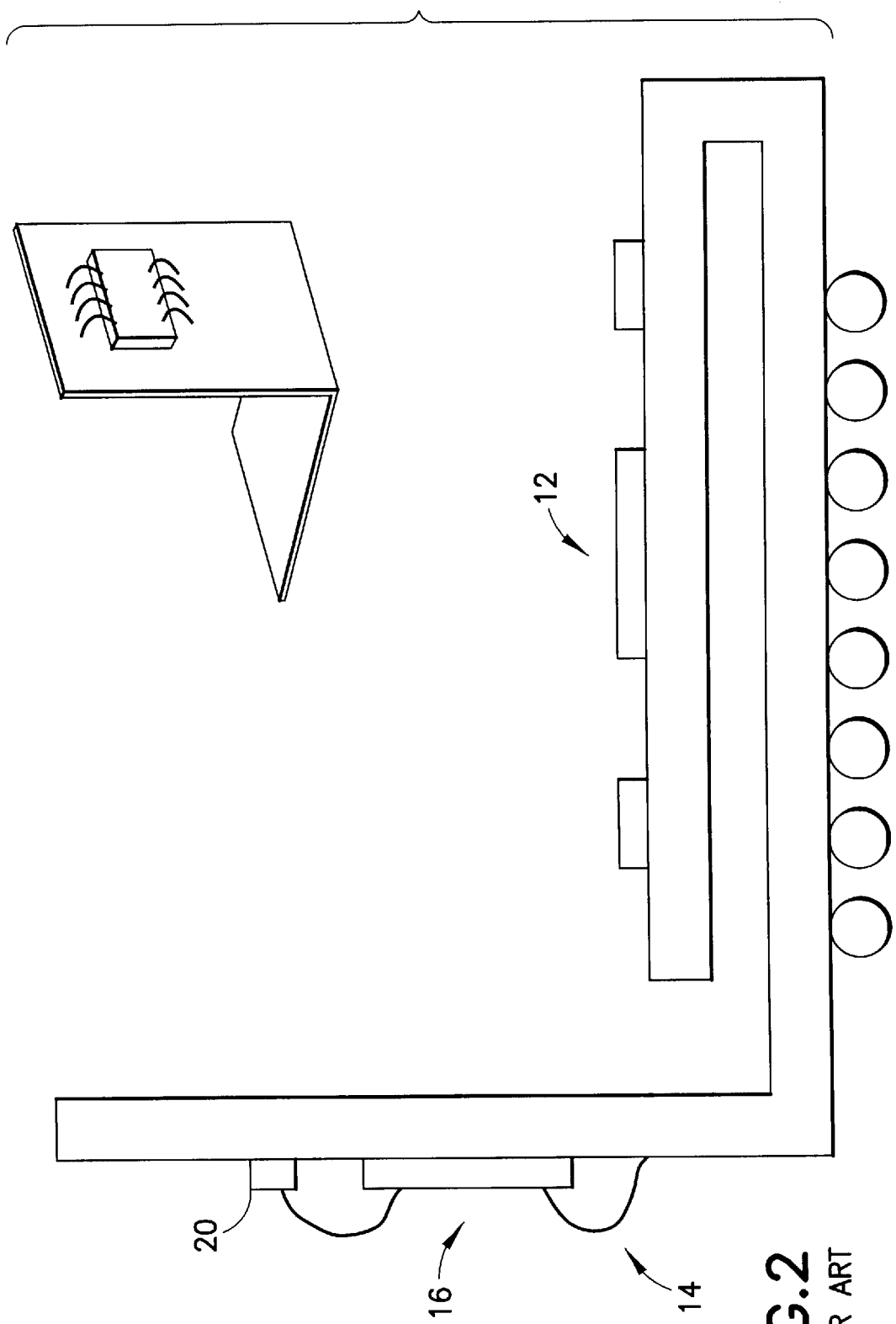
FIG. 2 shows one prior art example of a flex circuit arrangement.
Figure 3:
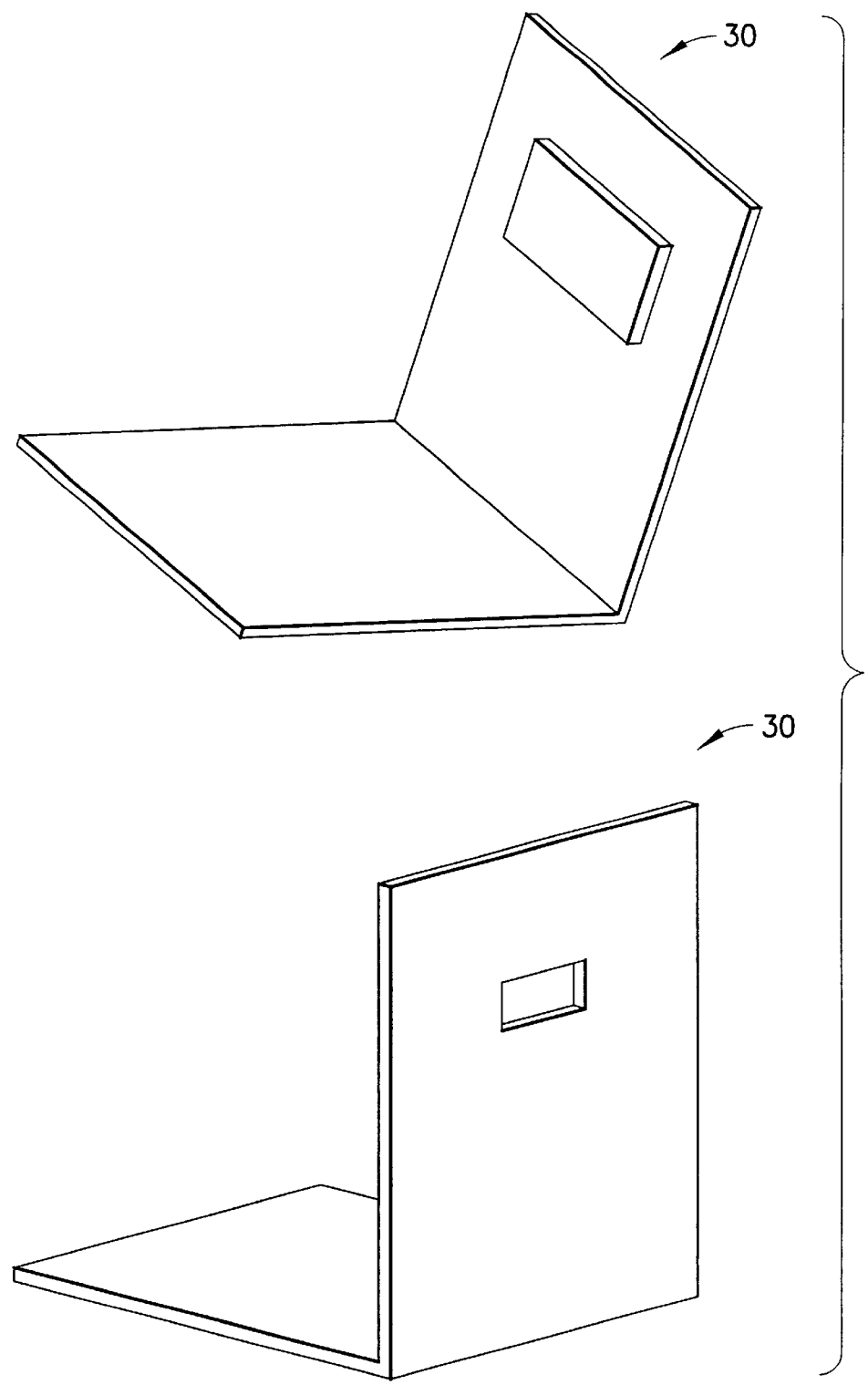
FIG. 3 shows, in perspective, an example of a dual side flex circuit in accordance with the invention.

The flex circuit is bent along the score or compression so that when released, or when connected to other components, it contains a right angle bend (i.e. one portion of the flex circuit is at a 90 degree angle to another part of the flex circuit, such as shown in FIGS. 3 and 4.

Normally, flip chip connection of an electronic chip to a flex circuit prevents access to the optical devices and mounting via a side opposite to the active side creates problems with cooling the chip.

Advantageously, by incorporating an opening 46 in the flex circuit design both optical access and cooling can be achieved without either interfering with the other.

In addition, a further advantage resulting from the technique described herein is that the flex circuit can be easily constructed such that additional auxiliary chips can be attached on the backside of the flex as well, such as shown in FIG. 4. In other words, the arrangement creates a dual-side accessible flex circuit so that electrical connections can be made on both sides. This allows for keeping the distance between the various pieces as short as possible so that the highest speeds can be attained.

In alternative variants, the 90 degree bend and/or the ability for the flex circuit to be "flexible" can be dispensed with. Instead, a single vertical carrier or support, for example a printed circuit card having appropriate connections and the through-hole could be used and configured to 'plug-into' or otherwise attach to a separate horizontal card to make the 90 degree turn, using any conventional technique for connecting two circuit boards at right angles.

In further variants, a combination of a vertical card and a flex circuit could be used, with one being horizontal and the other being vertical.

In still further variants two separate cards could be used with a third component, for example a common connector block, creating the right angle relationship between the two.

One potential drawback to using a two (or more) piece approach is that each separate connection adds parasitic electronic capacitance and inductance that may, in some cases, reach unacceptable levels.

In yet other variants the flex circuit is replaced by, for example, an insulator having electrically conductive traces and contacts on one or both sides, a printed circuit board, a multiwire board or a multi layer circuit board.

As will be apparent, our approach does not suffer from problems of the prior art, because the through-hole allows optical access to be maintained while providing easy access to the non-active side of the chip for heat sinking.

In summary overview, we use a flex circuit designed with a through-hole in it and then bond the optical or opto-electronic chip, using a flip-chip technique, to the back side of the flex circuit. The result is a dual-sided flex circuit which has contacts to the optical or opto-electronic chip on the backside and contacts for attachment of the flex circuit to another element, for example, a printed circuit board on the front side. The hole through the flex allows optical access while the placement of the optical or opto-electronic chip on the back of the flex circuit allows good thermal contact to be made with the optical or opto-electronic chip for cooling, each while allowing large numbers of connections between the IC and the flex circuit.

Thus, our approach provides for access to a greater number of electronic I/O pads than can be obtained using prior art techniques in the same area. It provides the ability to integrate electronic I/O pads on optical or opto-electronic chips in multi-tiered rows, even away from the chip edge. It minimizes parasitic electronic capacitance and inductance for the electronic chip-to-flex circuit connection. Finally, having the electronic chip on the backside of the flex circuit allows easy heat sink access.

Two representative examples of opto-electronic modules constructed in accordance with the teachings of the invention are shown commonly assigned U.S. Design patent application Ser. Nos. 29/144,363 and 29/144,365 which are incorporated herein by reference.

It should therefore be understood that the above description is only representative of illustrative embodiments. For the convenience of the reader, the above description has focused on a representative sample of all possible embodiments, a sample that teaches the principles of the invention. The description has not attempted to exhaustively enumerate all possible variations. That alternate embodiments may not have been presented for a specific portion of the invention, or that further undescribed alternate embodiments may be available for a portion, is not to be considered a disclaimer of those alternate embodiments. One of ordinary skill will appreciate that many of those undescribed embodiments incorporate the same principles of the invention and others are equivalent.

What is claimed is:

1. A method of packaging an optical chip that has been hybridized with an electronic chip to form an opto-electronic chip, the method comprising:

providing a flex circuit of the type having a first surface and a second surface opposite the first surface and having walls that defines an opening through the flex circuit from the first surface to the second surface, the opening lying in a plane parallel to the first surface;

bonding a front side of an opto-electronic chip to the second surface such that the electronic chip is located on a second surface side of the first surface and all optical signals passing to or from the opto-electronic chip occurs through the first surface via the opening so that the opening allows optical access to the opto-electronic chip and a back side of the opto-electronic chip is accessible for cooling.

2. The method of claim 1 further comprising connecting a heat sink to the back side of the opto-electronic chip for cooling.

3. The method of claim 2 further comprising maintaining unobstructed optical access to the opto-electronic chip following the connecting of the heat sink to the chip for cooling.

4. The method of claim 1, wherein the flex circuit further comprises a dual-sided flex circuit having contacts for the opto-electronic chip on the second surface and contacts for attachment of the flex circuit to another device on the first surface.

5. The method of claim 4 further comprising minimizing parasitic electronic capacitance and inductance for electronic chip-to-flex circuit connection.

6. The method of claim 1, wherein the flex circuit comprises a crease and the method further comprises bending the flex circuit along the crease.

7. The method of claim 6 wherein the bending comprises forming the flex circuit to a right angle bend.

8. A packaging method comprising:

providing a circuit board having a first side and a second side and an opening extending between the first side and the second side;

mounting an opto-electronic chip, having optical devices hybridized thereon, onto the second side of the circuit board by bringing together contacts located on a surface of the optoelectronic chip and contacts located on the circuit board without using wirebonds, the opto-electronic chip being mounted such that the optical devices are aligned with the opening so that access to the optical devices for the passage of an optical signal between one of the optical devices and another device will be through a plane defined by the first side and a cooling device can be coupled to a surface of the opto-electronic chip on a side of the opto-electronic chip opposite a side defined by the optical devices.

9. An optical apparatus comprising:

a carrier having a first side and a second side and electrical contacts on both the first and second sides, the carrier having an opening extending from the first side to the second side;

an opto electronic chip comprising an electronic chip hybridized to at least two active optical devices, the electronic chip having a first side defined by a point of connection between the at least two active optical devices and the electronic chip and a second side opposite the first side, the electronic chip further having additional electrical connections on the first side, the opto-electronic chip being connected to the carrier by a bond between the additional electrical connections and at least some of the electronic contacts on the second side of the carrier, the opto-electronic chip being further located so that the at least two active optical devices are located relative to the opening such that coupling of light between one of the at least two optical devices and another optical element will be through the opening.

10. The apparatus of claim 9 further comprising a heat sink coupled to the second side of the electronic chip.

11. The apparatus of claim 9 wherein the carrier is a flex circuit.

12. The apparatus of claim 9 wherein the carrier is a printed circuit board.

13. The apparatus of claim 9 wherein the carrier is an insulator having electrically conductive paths located on the first side and the second side.

14. The apparatus of claim 9 wherein the carrier comprises a flex circuit and wherein the flex circuit includes an indentation to facilitate bending of the flex circuit into a right angle shape.

* * * * *